WAVEGUIDE TUNNEL DIODE AMPLIFIER

Filed Feb. 1, 1966 2 Sheets-Sheet 1

INVENTOR.
HYMAN PLUTCHOK
BY John L. Lawler
ATTORNEY

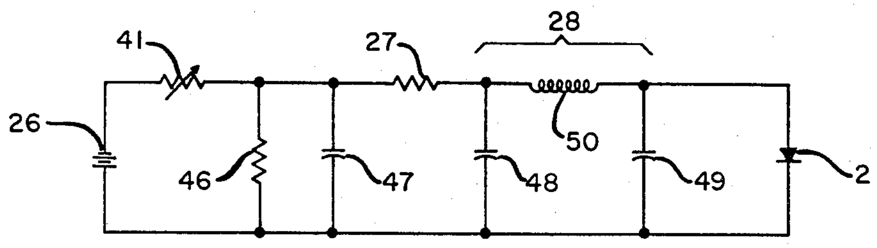
FIG-3
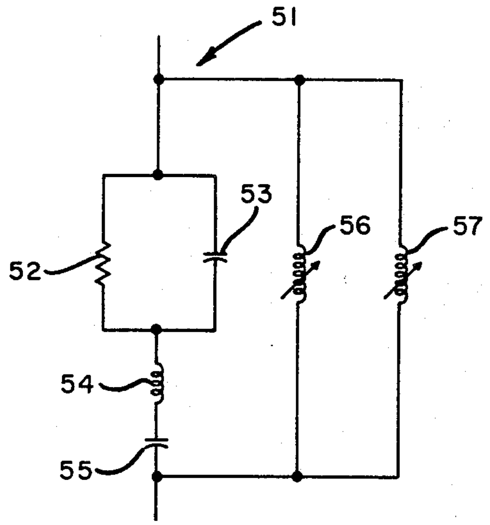
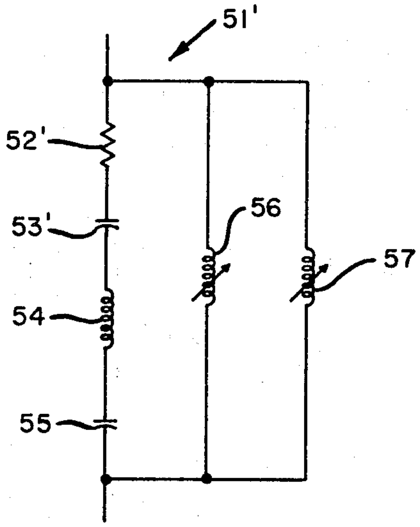
FIG-4 FIG-5
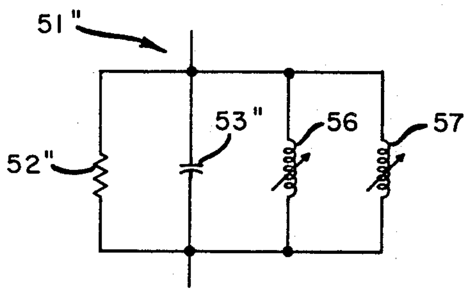
FIG-6
INVENTOR.
HYMAN PLUTCHOK
BY John F. Lawler
ATTORNEY United States Patent Office 3,411,101
Patented Nov. 12, 1968

3,411,101

WAVEGUIDE TUNNEL DIODE AMPLIFIER

Hyman Plutchok, Los Altos, Calif., assignor to Sylvania Electric Products Inc., a corporation of Delaware
Filed Feb. 1, 1966, Ser. No. 524,180
10 Claims. (Cl. 330—56)

This invention relates to waveguide tunnel diode amplifiers.

A tunnel diode is a semiconductor device that may be represented by a lead inductance that is in series with the shunt combination of a junction resistance having a negative value and a junction capacitance. In a tunnel diode amplifier, the junction resistance contributes directly to amplification of an incident signal. The reactance of the tunnel diode, however, may cause the amplifier to be unstable at high frequencies. It is therefore desirable at the operating frequencies of the amplifier to effectively remove the tunnel diode reactances from the circuit.

An object of this invention is the provision of an improved waveguide tunnel diode amplifier.

Another object is the provision of a tunable tunnel diode waveguide amplifier.

Another object is the provision of a stable tunnel diode amplifier operating at microwave frequencies.

These and other objects are accomplished in accordance with this invention by a tunnel diode and a capacitor that are connected in series between opposite walls of waveguide and an electrically conductive dual diameter post that is also connected to the opposite walls of the waveguide. The tunnel diode has a lead inductance that is in series with the capacitor. The series tunnel diode circuit may be represented by an equivalent resistance having a negative value for amplifying an incident signal and an equivalent shunt capacitance. The post inductance is shunt resonant with the equivalent capacitance at the operating frequency of the amplifier to effectively remove this reactance from the circuit. The operating frequency of the amplifier is varied by rotation of the post to change its effective diameter in the waveguide, and thus to change the post inductance and the resonant frequency of the shunt resonant circuit. The lead inductance reduces the equivalent resistance at high frequencies and causes the amplifier to be unstable. The equivalent resistance is varied to stabilize the amplifier by changing the capacitance in series with the tunnel diode.

This invention will be more fully understood from the following description of a preferred embodiment thereof together with the accompanying drawings in which:

FIGURE 3 is a schematic diagram of the circuit equivalent of bias circuit 5; and FIGURES 4, 5, and 6 are schematic diagrams of the circuit equivalents of the tunnel diode amplifier.

Figure 1:
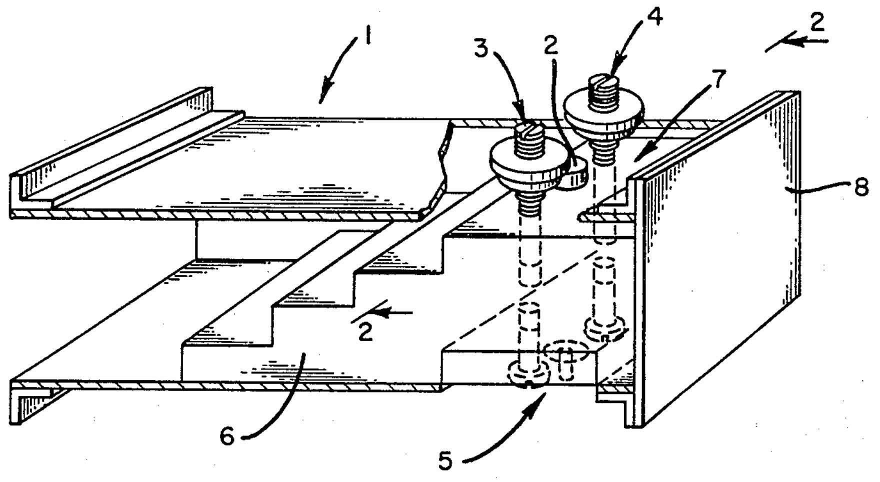
FIGURE 1 is a perspective view, partially broken away, of a waveguide tunnel diode amplifier embodying this invention.
Figure 2:
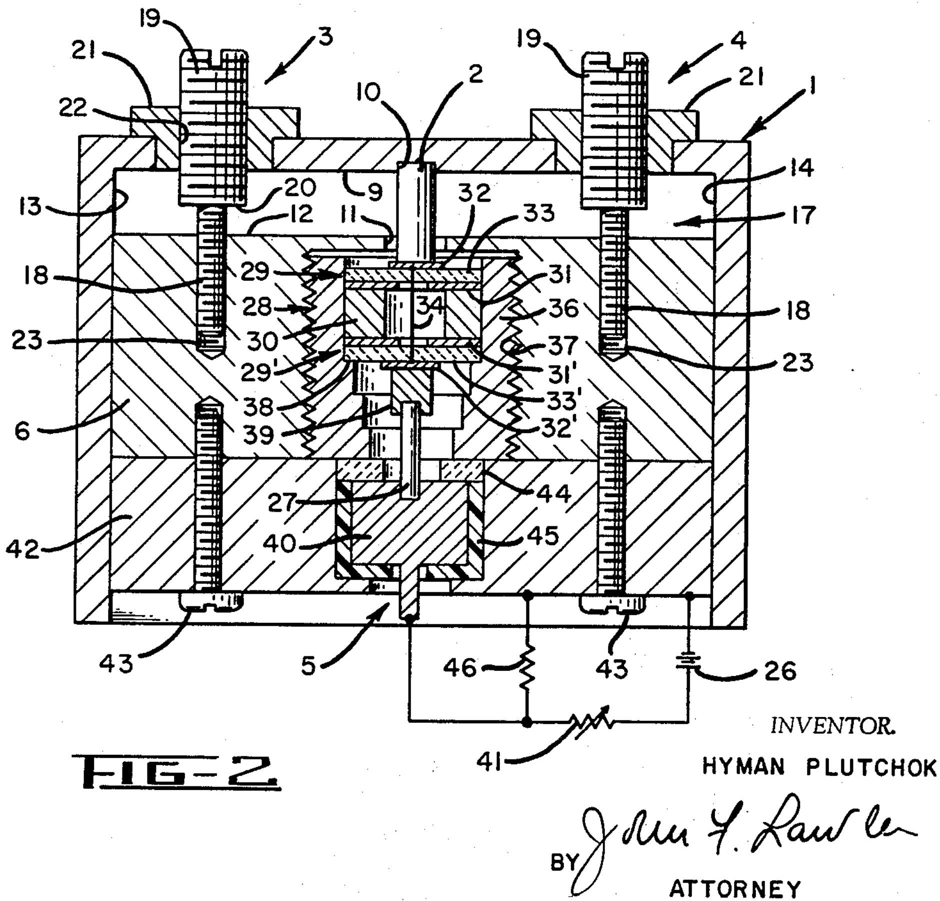
FIGURE 2 is a section and schematic view of the waveguide tunnel diode amplifier taken along line 2—2 of FIGURE 1.

Referring to FIGURES 1 and 2, a waveguide tunnel diode amplifier embodying this invention comprises a waveguide 1, a tunnel diode 2, a pair of dual-diameter posts 3 and 4, and a bias circuit 5.

In order to match the characteristically low impedance of the tunnel diode to the high impedance of standard rectangular waveguide, a step-type impedance transformer 6 is included in the waveguide. This impedance transformer reduces the height of the waveguide in a series of steps to a predetermined value which defines a low impedance waveguide section 7 having an impedance in the order of 20 ohms.

Tunnel diode 2 and posts 3 and 4 are located in the low impedance waveguide section and are spaced from a shorting plate 8 on one end of the waveguide by a quarter wavelength at the operating frequency of the amplifier. One terminal of tunnel diode 2 is connected to waveguide wall 9 in an opening 10 therein. The other terminal of the tunnel diode extends through an opening 11 in waveguide wall 12. The tunnel diode is located midway between the narrow waveguide walls 13 and 14. Each post is located approximately midway between one of the narrow walls and the tunnel diode.

Posts 3 and 4 are substantially identical in construction and therefore only one post will be described. Post 3 is oriented perpendicular to broad walls 9 and 12 and comprises a first section 18 and a second section 19 of comparatively larger diameter having a shoulder 20 at its junction with the first section. The post is threaded over its length with the threads of each section having the same pitch. The post may be cut from a single piece of electrically conductive bar stock or may be formed from two threaded lengths of such stock secured together in an end-to-end relationship. The lengths of post sections 18 and 19 are each greater than the short cross-sectional dimension of the waveguide so that either post section may be positioned to extend across the full height of the waveguide.

Nut plate 21, preferably made of brass, is permanently secured in broad wall 9 by silver solder or the like and has a threaded opening 22 therein. Broad wall 12 also has a threaded opening 23 therein which is axially aligned with opening 22. The threads of openings 22 and 23 have the same pitch as the threads of post 3 to prevent interference when the post is rotated therein and may be formed simultaneously in the waveguide by means of a dual-diameter tap. Alternatively, the post may first be screwed into opening 23 in broad wall 12 until shoulder 20 is between the broad walls. Nut plate 21 is then threaded over post section 19 into tight abutment with waveguide wall 9 and soldered thereto.

Bias circuit 5, see FIGURE 2, comprises a source 26 of DC voltage which is connected through a microwave thin-film rod resistor 27 and low-pass filter 28 to the tunnel diode. The low-pass filter is a capacitive input pi section filter comprising a pair of disc reactive elements 29 and 29′ of the type disclosed in Patent 3,167,729 entitled "Microwave Filter Insertable Within Outer Wall of Coaxial Line." The disc reactive elements 29 and 29′ are spaced a fixed distance apart by a sleeve 30. Each disc reactive element has an electrically conductive ring 31 and disc 32 formed on opposite sides of an insulator disc 33. Conductive rings 31 and 31′ are soldered to opposite ends of sleeve 30 to form a rigid structure. Conductive discs 32 and 32′ are soldered to opposite ends of a wire conductor 34 which is coaxial with sleeve 30. The wire conductor provides a prescribed inductance between discs 32 and 32′. The associated conductive rings 31 and 31′ and discs 32 and 32′ each overlap to provide a shunt capacitor having one terminal connected to the associated opposite ends of wire conductor 34.

Filter 28 is housed in an externally threaded ring member 36 which is screwed into a threaded opening 37 in waveguide wall 12. The filter fits snugly in the opening in ring member 36 and is held there by friction. The axial position of the filter in ring member 36 is determined by shoulder 38 which contacts insulator disc 33′. An electrically conductive cylindrical member 39 having an opening in one end thereof is soldered to conductive disc 32′.

When the amplifier is assembled, the waveguide (see FIGURE 2) is inverted and one terminal of tunnel diode 2 is pressed into the opening 10 in broad wall 9. Ring member 36 is then screwed into opening 37 in broad wall 12 until conductive disc 32 abuts firmly against and makes electrical contact with the other terminal of the tunnel diode to electrically connect it through the shunt capacitance of disc reactive element 29 and ring member 36 to the waveguide. Resistor 27 is then inserted in the opening in cylindrical member 39 and is electrically connected through conductive member 40 and potentiometer 41 to voltage source 26. Conductive member 40 and resistor 27 are secured in the waveguide assembly by end plate 42 which is attached to the waveguide by screws 43. Conductive member 40 is electrically insulated from ring member 36 and end plate 42 by a disc 44 and sleeve 45, respectively, which are made of electrically nonconductive material such as ferroelectric ceramic and Teflon, respectively, to provide a maximum shunt capacitance between one end of resistor 27 and the waveguide. The one end of resistor 27 is also electrically connected to the waveguide through conductive member 40 and resistor 46.

The circuit equivalent of the bias circuit is illustrated in FIGURE 3 wherein capacitor 47 represents the capacitance between the one end of resistor 27 and the waveguide, capacitors 48 and 49 represent the capacitances provided by disc reactive elements 29 and 29', respectively, and inductor 50 represents the inductance of wire conductor 34. Potentiometer 41 and resistor 46 form a voltage divider connected across battery 26 to provide a constant DC bias voltage across resistor 46 and tunnel diode 2. The low-pass filter 28, which comprises capacitors 48 and 49 and inductor 50, is designed to have a cutoff frequency that is approximately ⅓ the operating frequency of the tunnel diode amplifier.

In operation, potentiometer 41 is adjusted to bias tunnel diode 2 to exhibit a junction resistance having a negative value. An incident signal applied to the open end of the waveguide (at the left in FIGURE 1) is amplified by the negative resistance of the tunnel diode. The amplified signal is also coupled from the open end of the waveguide. In addition to exhibiting a junction resistance having a negative value, however, the tunnel diode is comprised of a number of reactive components which adversely affect the operation of the amplifier.

The circuit equivalent of the tunnel diode illustrated at 51 in FIGURE 4 comprises the shunt combination of a junction resistor 52 and a junction capacitor 53 connected in series with a lead inductance represented by inductor 54. The tunnel diode also exhibits a resistance in series with a lead inductance and a cartridge capacitance in shunt with the junction capacitance and lead inductance. The cartridge capacitance and series resistance are small, however, and are therefore neglected in this analysis. The capacitor 55 represents a portion of the capacitance provided by disc reactive element 29. Variable shunt inductors 56 and 57 represent the inductances provided by posts 3 and 4. The series circuit indicated at 51 may be represented by the circuit equivalent 51' in FIGURE 5 and the circuit equivalent 51'' in FIGURE 6. The derivation of equivalent series and parallel circuits is described in "Electrical Engineering Circuits" by H. H. Skilling, page 97, John Wiley and Sons, Inc., 1957. The parallel circuit comprising resistor 52 and capacitor 53 is represented in FIGURE 5 by the series circuit equivalent comprising resistor 52' and capacitor 53'. Similarly, the series circuit 51' in FIGURE 5 is represented in FIGURE 6 by the equivalent circuit 51'' which comprises an equivalent shunt resistor 52'' and an equivalent shunt capacitor 53''.

In order to stabilize the tunnel diode amplifier, the resistance in shunt with the tunnel diode must be less than the absolute value of the equivalent resistance of the tunnel diode. Referring to FIGURE 3, thin-film rod resistor 27 is a good microwave termination for filter 28 and has a resistance that is approximately one-half the absolute value of the equivalent resistance of resistor 52''. Resistor 46, however, has a resistance that is less than one-half the absolute value of the equivalent resistance of the tunnel diode. Shunt capacitor 47 is effectively a short circuit for signals having a frequency greater than approximately 100 megacycles. Thus, at frequencies between 100 megacycles and the cutoff frequency of low-pass filter 28, rod resistor 27 is effectively electrically connected in shunt with the tunnel diode and the amplifier is stabilized at these frequencies. At frequencies less than 100 megacycles, the series combination of rod resistor 27 and resistor 46 are effectively electrically connected in shunt with the tunnel diode and the amplifier is stabilized at these frequencies.

The effect of the tunnel diode lead inductance of inductor 54 on the circuit is seen by analyzing the expression for the gain of the circuit and the equivalent resistance of resistor 52''. The gain of the amplifier is representable as $$G=|K|^2 \qquad (1)$$

where K is the reflection coefficient and is representable as $$K=\frac{Y_o-Y_{amp}}{Y_o+Y_{amp}} \qquad (2)$$

where $Y_o$ is the admittance of the circuit connected across the open end of the waveguide in FIGURE 1 and $Y_{amp}$ is the admittance of the amplifier. Substituting Equation 2 and the expression for the amplifier admittance into Equation 1, the gain of the amplifier is representable as $$G=\left|\frac{Y_o-(g+jb)}{Y_o+(g+jb)}\right|^2 \qquad (3)$$

$$=\frac{(Y_o-g)^2+b^2}{(Y_o+g)^2+b^2} \qquad (4)$$

$$=\frac{\left(Y_o-\frac{1}{R_2}\right)^2+\left(\frac{1}{X_2}\right)^2}{\left(Y_o+\frac{1}{R_2}\right)^2+\left(\frac{1}{X_2}\right)^2} \qquad (5)$$

where $Y_{amp}=g+jb$, $g=1/R_2$ is the conductance and $R_2$ is the resistance of resistor 52'' and each has a negative value, and $b=1/X^2$ is the susceptance and $X_2$ is the reactance of capacitor 52''.

The tunnel diode equivalent resistance $R_2$ of resistor 52'' is representable as $$R_2=\frac{R_1^2+X_1^2}{R_1} \qquad (6)$$

$$=\frac{R}{1+(R\omega C)^2}+\frac{\left(\omega L-\frac{1}{\omega C_f}-\frac{R^2\omega C}{1+(R\omega C)^2}\right)^2}{\frac{R}{1+(R\omega C)^2}} \qquad (7)$$

where $$R_1=\frac{R}{1+(R\omega C)^2}$$

is the equivalent resistance of resistor 52', $X_1$ is the reactance of the series circuit indicated at 51', R is the junction resistance of capacitor 53, L is the lead inductance of inductor 54, $C_f$ is the capacitance of capacitor 55 and $\omega=2\pi f$ is the operating frequency $f$ of the amplifier expressed in radians per second. Neglecting the effect of capacitor 55 ($1/\omega C_f$ in Equation 7), reference to Equation 7 reveals that the reactance $\omega L$ of the lead inductance of conductor 54

$$\left(\omega L<\frac{R^2\omega C}{1+(R\omega C)^2}\right)$$

causes the absolute value of the equivalent resistance $R_2$ to decrease, and to be less than the absolute value of the junction resistance R. Reference to Equation 5 reveals that a decrease in the absolute value of the equivalent resistance $R_2$ (note that $R_2$ is negative) causes the gain of the amplifier to increase. At microwave frequencies, the reactance of the lead inductance and the gain of the amplifier increase sufficiently to cause the amplifier to be unstable.

It is desirable therefore to remove the lead inductance from the circuit at the operating frequency of the amplifier.

In accordance with this invention, the lead inductance of inductor 54 is removed from the circuit and the equivalent resistance $R_2$ of resistor 52'' is thus controlled by adjusting the capacitance $C_f$ (the reactance $1/\omega C_f$ in Equation 7) of capacitor 55. If the reactance $1/\omega C_f$ of capacitor 55 is adjusted to be greater than the reactance $\omega L$ of lead inductor 54, the equivalent resistance $R_2$ of the tunnel diode is increased. Reference to Equation 5 reveals that an increase in the equivalent resistance $R_2$ causes a decrease in the gain of the amplifier. The capacitance $C_f$ is adjusted empirically to the proper value to make the amplifier stable and to provide the required gain. In practice, capacitor 55 represents a portion of the capacitance of disc reactive element 29 which is designed to have a capacitance greater than that required by low-pass filter 28.

The post inductances of inductors 56 and 57 (provided by posts 3 and 4) are shunt resonant with the tunnel diode equivalent capacitance of capacitor 53'' at the operating frequency of the amplifier to effectively remove the equivalent capacitance from the circuit.

The operating frequency of the amplifier is varied by changing the frequency at which the inductances of the posts are resonant with the equivalent capacitance of capacitor 53''. This tuning is accomplished by rotating posts 3 and/or 4 to change the position of shoulder 20 in the waveguide. This movement of shoulder 20 changes the effective diameter of the post in the waveguide and the inductance provided thereby. The post inductance is minimum when shoulder 20 is flush with waveguide wall 9 such that only the smaller diameter post section 18 is in the waveguide. Conversely, maximum inductance is provided when shoulder 20 abuts against wall 12 and only the larger diameter post section 19 is in the waveguide.

By way of example, a waveguide tunnel diode amplifier having the following dimensions and characteristics was constructed and successfully operated:

*Tunnel diode*

| | | |
|---|---|---|
| General Electric TD 406 Germanium micropill diode: | | |
| $R_j$ | | —75Ω |
| $C_j$ | pf | 0.25 |
| Cutoff frequency | gc | 30 |
| Axial position from shorting plate **8** | inch | 0.300 |
| Filter **28**: | | |
| Capacitor **48** | pf | 1.5 |
| Capacitor **49** | pf | 1.5 |
| Inductor **50** | nh | 1.0 |
| Cutoff frequency | gc.p.s | 4.3 |
| Capacitor **47** | pf | 800 |
| Resistor **27** | | 25Ω |
| Resistor **46** | | 10Ω |
| Potentiometer **41** | | 200Ω |
| Waveguide, low height (X-band): | | |
| Width | inch | 0.900 |
| Height | do | 0.020 |
| Posts **3** and **4**: | | |
| Diameter, section **18** | do | 0.112 |
| Diameter, section **19** | do | 0.190 |
| Threads per inch | | 40 |
| Distance from narrow walls **13** and **14** | inch | 0.250 |
| Design frequency | gc | 10–12.4 |
| 3 db bandwidth | mc | ≈300 |
| Gain (at center frequency $f$=12.4 gc.) | db | 15 |
| Tuning range (caused by posts **3** and **4**) | gc | 12–12.6 |

Although this invention has been described in relation to specific embodiments thereof, variations and modifications will be apparent to those skilled in the art. The scope and breadth of this invention is, therefore, to be determined from the following claims rather than from the above detailed description.

What is claimed is:

1. A tunnel diode amplifier having prescribed operating frequencies comprising a waveguide for propagating electromagnetic wave signals, a tunnel diode having first and second terminals, said tunnel diode being oriented in said waveguide transversely to wave propagation therein, means for coupling said terminals of said tunnel diode to said waveguide, bias means operable to bias said tunnel diode into its negative resistance region for amplifying electromagnetic signals, an electrically conductive post extending through said waveguide transversely of the direction of wave propagation in the waveguide and being electrically connected to said waveguide at junctions of said post and said waveguide, said post providing a reactance in said waveguide, and means for moving said post in the interior of said waveguide, said post having first and second sections with different cross-sectional dimensions measured transversely to the directions of post movement and wave propagation in the waveguide whereby post movement changes the lengths of said differently dimensioned post sections within the waveguide to correspondingly vary the reactance produced by the post and the operating frequencies.

2. The amplifier according to claim 1 wherein said tunnel diode is biased to have a first equivalent circuit comprising the shunt combination of a first equivalent resistance having a negative value and a first equivalent reactance coupled to said waveguide and wherein said post provides a reactance in shunt with the first equivalent reactance of said tunnel diode.

3. The amplifier according to claim 2 wherein the first equivalent reactance of said tunnel diode is capacitive and the reactance of said post is inductive, said first equivalent reactance and said post reactance being shunt resonant at the center operating frequency of the amplifier.

4. The amplifier according to claim 3 wherein each of said post sections is cylindrical, has a different diameter, and has a threaded circumference, wherein said waveguide is rectangular waveguide comprising first and second pairs of opposed walls, said walls of said first pair of opposed walls having axially aligned threaded openings therein for receiving said post sections, said tunnel diode being electrically connected to said walls of said first pair of opposed walls, and including an electrically conductive shorting plate closing one end of said waveguide and being electrically connected to said waveguide walls.

5. The amplifier according to claim 1 wherein said tunnel diode is biased to have a second equivalent circuit which is coupled to said waveguide, said tunnel diode second equivalent circuit comprising a lead inductor in series with the shunt combination of a second junction resistor having a negative value and a second junction capacitor, and wherein said coupling means comprises a third reactive element electrically connecting the first terminal of said tunnel diode to said waveguide at the operating frequencies of the amplifier, said first reactive element being in series with the lead inductor of said tunnel diode.

6. The amplifier according to claim 5 wherein said third reactive element is a third capacitor and wherein said third capacitor and said tunnel diode comprise a third equivalent circuit coupled to said waveguide and comprising the shunt combination of a third equivalent resistor having a negative resistance and a fourth equivalent capacitor, said post providing an inductive reactance in shunt resonance with the capacitance of the fourth equivalent capacitor at the center operating frequency of the amplifier.

7. The amplifier according to claim 6 wherein said bias means includes a low-pass filter for blocking electromagnetic signals to be amplified from said bias means, said filter comprising said third capacitor.

8. The amplifier according to claim 7 including an electrically conductive shorting plate closing one end of said waveguide and being electrically connected to said waveguide and wherein said tunnel diode and said post are each located in said waveguide from said shorting plate approximately one-quarter wavelength at the center operating frequency of the amplifier.

9. The amplifier according to claim 8 wherein each of said post sections is cylindrical, has a different diameter, and has a threaded circumference, wherein said waveguide is rectangular waveguide comprising first and second pairs of opposed walls, said walls of said first pair of opposed walls having axially aligned threaded openings therein for receiving said post sections, said tunnel diode being electrically connected to said walls of said first pair of opposed walls, and including a step impedance transformer for reducing the height and characteristic impedance of said waveguide to provide a low-height waveguide section having a relatively low characteristic impedance adjacent said shorting plate, said tunnel diode and said post being located in said low-height waveguide section.

10. The amplifier according to claim 9 wherein said filter has a first terminal connected to the first terminal of said tunnel diode, has a second terminal connected to said waveguide and has a third terminal, said bias means including a source of DC potential having a first terminal connected to said wavelength and having a second terminal, including a thin-film microwave rod resistor having a first terminal connected to the third terminal of said filter and having a second terminal, including a fifth capacitor having a first terminal electrically connected to said waveguide and having a second terminal electrically connected to the second terminal of said rod resistor for bypassing high frequency signals applied thereto, including a fourth resistor having a first terminal electrically connected to said waveguide and having a second terminal electrically connected to the second terminal of said rod resistor, and including a fifth resistor having a first terminal connected to the second terminal of said DC source and having a second terminal electrically connected to the second terminal of said rod resistor.

References Cited

UNITED STATES PATENTS

| | | | |
|---|---|---|---|
| 3,169,227 | 2/1965 | Closson ___________ | 330—56 X |
| 3,209,276 | 9/1965 | Fricke et al. __________ | 330—56 |

NATHAN KAUFMAN, *Primary Examiner.*